United States Patent [19]
Parris et al.

[11] Patent Number: 5,929,478
[45] Date of Patent: Jul. 27, 1999

[54] SINGLE LEVEL GATE NONVOLATILE MEMORY DEVICE AND METHOD FOR ACCESSING THE SAME

[75] Inventors: Patrice Michael Parris; Yee-Chaung See, both of Phoenix, Ariz.; Irenee M. Pages, Villeneuve Tolosane, France; Juan Buxo, Mesa, Ariz.; Eric Scott Carman, Toulouse, France; Thierry Michel Sicard, Mesa, Ariz.; Quang Xuan Nguyen, Castanet, France

[73] Assignee: Motorola, Inc., Schaumburg, Ill.

[21] Appl. No.: 08/886,746

[22] Filed: Jul. 2, 1997

[51] Int. Cl.$^6$ .......................... H01L 29/76; H01L 29/88; H01L 29/792
[52] U.S. Cl. .......................... 257/314; 259/315; 259/324
[58] Field of Search ...................... 257/314–325, 257/296, 300, 68, 295, 904, 347, 370, 369; 438/257–260; 365/185

[56] References Cited

U.S. PATENT DOCUMENTS

| | | | |
|---|---|---|---|
| 4,649,520 | 3/1987 | Eitan | 365/185 |
| 5,386,135 | 1/1995 | Nakazato et al. | 257/369 |
| 5,414,291 | 5/1995 | Miwa et al. | 257/370 |
| 5,434,441 | 7/1995 | Inoue et al. | 257/347 |
| 5,465,231 | 11/1995 | Ohsaki | 257/315 |
| 5,501,996 | 3/1996 | Yang et al. | 438/259 |
| 5,519,243 | 5/1996 | Kikuda et al. | 257/296 |
| 5,618,688 | 4/1997 | Reuss et al. | 257/370 |
| 5,747,846 | 5/1998 | Iida et al. | 257/314 |
| 5,764,569 | 6/1998 | Wright | 365/185 |

FOREIGN PATENT DOCUMENTS 407288291  10/1995  Japan.

OTHER PUBLICATIONS

A Scaled 0.6$\mu$m High Speed PLD Technology Using Single–Poly EEPROM's Adam et al. Sharp Corp., IC Group, VLSI Research & Devel. Lab. IEEE 1995 Custom Integrated Circuits Conference.

A New Single–Poly Flash Memory Cell with Low–voltage and Low–power Operations for Embedded Applications Min–hwa et al. MSE140, Advanced Technology Group, 1997.

"A EEPROM using a Single–Poly Soi–CMOSProcess" by Paul M. Solomon and Lisa T.Su; The 15th Annual IEEE Non–Volatile Semiconductor Memory Workshop; Monterey, CA, Feb. 1997.

*Primary Examiner*—Tom Thomas
*Assistant Examiner*—Cuong Q Nguyen
*Attorney, Agent, or Firm*—Kenneth M. Seddon

[57] ABSTRACT

A single level gate NVM device (20) includes a floating gate FET (11) and a capacitor (12) fabricated in two P-wells (27, 28) formed in an N-epitaxial layer (22) on a P-substrate (21). P+ sinkers (29, 31) and N-type buried layers (25, 26) provide isolation between the two P-wells (27, 28). The NVM device (20) is programmed or erased by biasing the FET (11) and the capacitor (12) to move charge carriers onto or away from a conductive layer (36) which serves as a floating gate (14) of the FET (11). Data is read from the NVM device (20) by sensing a current flowing in the FET (11) while applying a reading voltage to the capacitor (12).

9 Claims, 4 Drawing Sheets

SINGLE LEVEL GATE NONVOLATILE MEMORY DEVICE AND METHOD FOR ACCESSING THE SAME

BACKGROUND OF THE INVENTION

The present invention relates, in general, to memory devices and, more particularly, to nonvolatile memory devices.

Electrically Erasable Programmable Read Only Memory (EEPROM) permits storing data that can be retained even if power to the memory is removed. An EEPROM cell stores data by storing electrical charge in an electrically isolated floating gate of a Field Effect Transistor (FET). The stored charge controls the threshold of the FET, thereby controlling the memory state of the EEPROM cell. Two common structures for an EEPROM cell are a double poly structure and a single poly structure. The double poly structure is conventionally fabricated using two polycrystalline silicon layers. The single poly structure requires only one polycrystalline silicon layer and, therefore, is simpler and less expensive to fabricate than the double poly structure.

In a single poly nonvolatile memory cell, an isolated region in the silicon substrate controls the memory state of the memory cell. A floating polycrystalline silicon gate covers both the gate oxide layer of the FET and a dielectric layer above the isolated region. Conventionally, the isolated region is a well of one conductivity type, e.g., N conductivity type, in the silicon substrate of a complementary conductivity type, e.g., P conductivity type. Because the P-N junction between the well and the substrate should be reverse biased to provide isolation between the well and the substrate, a well in the substrate can be used to either program or erase the memory cell. Thus, a single poly novolatile memory device having a single well is usually either electrically erasable or electrically programmable, but not both. A conventional single poly EEPROM cell includes two wells in the substrate, one for electrically programming the memory cell and the other for electrically erasing the memory cell. Therefore, the conventional single poly EEPROM cell requires a large silicon area.

Accordingly, it would be advantageous to have a nonvolatile memory device and a method for accessing the nonvolatile memory device. It is desirable for the nonvolatile memory device to be simple and inexpensive to fabricate. It is also desirable for the nonvolatile memory device to be silicon area efficient. It would be of further advantage for the nonvolatile memory device to be both electrically programmable and electrically erasable.

BRIEF DESCRIPTION OF THE DRAWINGS

It should be noted that the cross-sectional views are not drawn to scale and that the same reference numerals are used in the figures to represent elements of similar structure and function.

DETAILED DESCRIPTION OF THE DRAWINGS

Generally, the present invention provides a Non-Volatile Memory (NVM) device and a method for accessing the NVM device. The NVM device includes a floating gate transistor and a capacitor coupled to the floating gate of the transistor. The transistor and the capacitor are fabricated on a semiconductor substrate. In accordance with the present invention, the capacitor is biased to control the voltage of the floating gate during both the programming and erasing processes.

Figure 1:
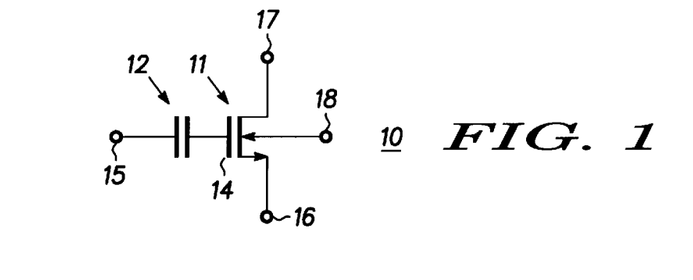
FIG. 1 is a schematic diagram of a single level gate nonvolatile memory device in accordance with the present invention.

FIG. 1 is a schematic diagram of a single level gate nonvolatile memory device 10 in accordance with the present invention. NVM device 10 includes a floating gate transistor 11 and a capacitor 12. By way of example, transistor 11 is an n-channel insulated gate Field Effect Transistor (FET). FET 11 has a floating gate 14 connected to one electrode of capacitor 12. The other electrode of capacitor 12 serves as a control terminal 15 of NVM device 10. A source electrode of FET 11 serves as a source terminal 16 of NVM device 10. A drain electrode of FET 11 serves as a drain terminal 17 of NVM device 10. A substrate electrode of FET 11 serves as a substrate terminal 18 of NVM device 10. Voltage signals are applied to control terminal 15 to set the voltage level of floating gate 14 during the processes of programming, erasing, and reading NVM device 10. The processes of programming and erasing NVM device 10 depend on the relation between the capacitance of capacitor 12 and the gate capacitance of FET 11.

It should be understood that FET 11 is not limited to being an n-channel insulated gate FET as shown in FIG. 1. FET 11 can be replaced by any type of transistor that has a gate structure, e.g., a p-channel insulated gate FET, an insulated gate bipolar transistor, a High Electron Mobility Transistor (HEMT), or the like. As those skilled in the art are aware, the source and drain electrodes of a FET serve as current conducting electrodes of a transistor. FIG. 1 shows that NVM device 10 includes one bit cell. It should be noted that this is not a limitation of the present invention. NVM device 10 can include any number of bit cells. Each bit cell includes a floating gate transistor and a capacitor as shown in FIG. 1. In a multiple bit cell NVM device, the bit cells are usually arranged in rows and columns.

Figure 2:
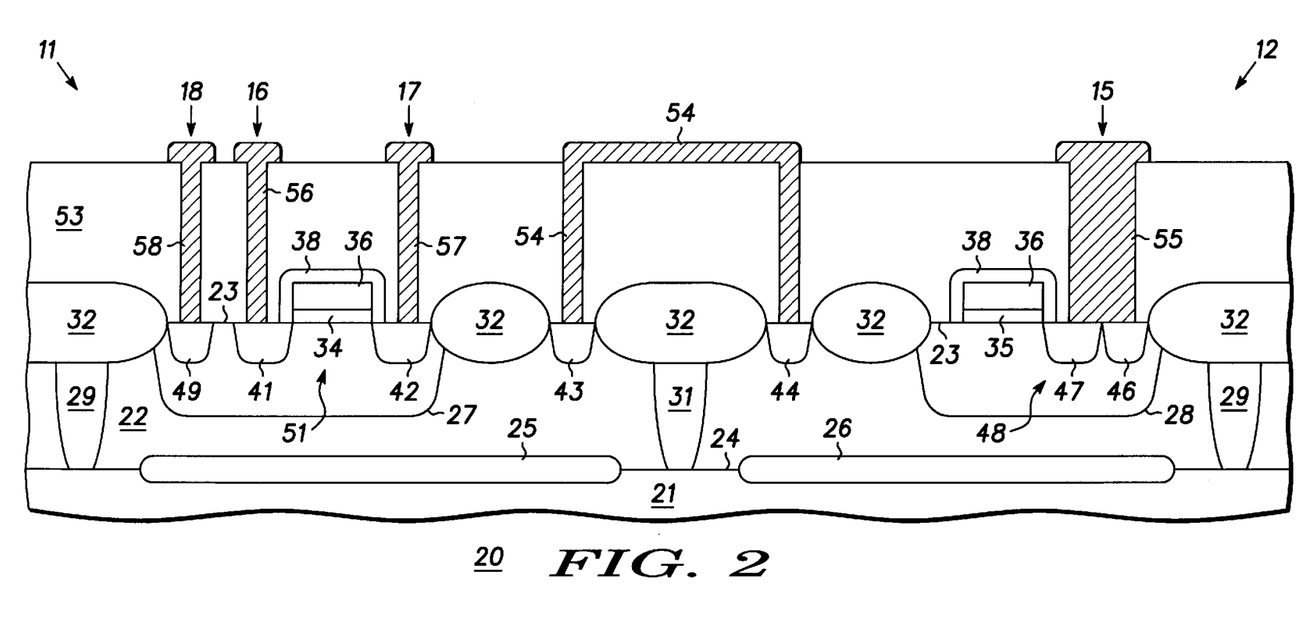
FIGS. 2–5 illustrate, in cross-sectional views, various embodiments of the single level gate nonvolatile memory device schematically shown in FIG. 1.

FIG. 2 is a cross-sectional view of an NVM device 20 in accordance with a first embodiment of the present invention. Schematically, NVM device 20 is represented by NVM device 10 shown in FIG. 1. NVM device 20 is fabricated on a semiconductor substrate 21. A body of semiconductor material, e.g., a semiconductor layer 22 is disposed on semiconductor substrate 21. By way of example, semiconductor substrate 21 is a silicon substrate of P conductivity type, and semiconductor layer 22 is a silicon layer of N conductivity type epitaxially grown on substrate 21. The thickness of epitaxial layer 22 is, for example, approximately 5 micrometers ($\mu$m). Epitaxial layer 22 has a dopant concentration between, for example, approximately $1 \times 10^{12}$ atoms per cubic centimeter (atoms/cm$^3$) and approximately $5 \times 10^{16}$ atoms/cm$^3$. Epitaxial layer 22 has a major surface 23 facing away from an interface 24 between epitaxial layer 22 and substrate 21.

N conductivity type buried layers 25 and 26 are formed in epitaxial layer 22 adjacent interface 24. Buried layers 25 and 26 may extend into substrate 21. Preferably, buried layers 25 and 26 have a dopant concentration higher than that of epitaxial layer 22. The high dopant concentration of buried layers 25 and 26 improves the isolation between substrate 21 and epitaxial layer 22. It should be understood that the dopant concentration of buried layer 25 is not limited to being the same as that of buried layer 26. It should also be understood that buried layers 25 and 26 are optional in NVM device 20.

Ion implantation and/or diffusion processes are performed to form highly doped P conductivity type sinkers 29 and 31 in epitaxial layer 22. Sinkers 29 and 31, which are referred to as P+ sinkers or P+ plugs, extend from major surface 23 to interface 24. Additional ion implantation and/or diffusion processes are performed to form wells 27 and 28 of P conductivity type in epitaxial layer 22. Wells 27 and 28 extend from major surface 23 into epitaxial layer 22. Preferably, wells 27 and 28 do not reach buried layers 25 and 26, respectively, or contact interface 24. In other words, wells 27 and 28 preferably extend from major surface 23 partially into epitaxial layer 22. Preferably, sinker 29 is configured as a ring structure that surrounds wells 27 and 28. FIG. 2 shows a cross section of the ring structure. In addition, sinker 31 is preferably configured to separate well 27 from well 28. Isolation structures such as, for example, field oxide regions 32 are formed over epitaxial layer 22 using techniques well known to those skilled in the art. Preferably, ion implantation is performed before forming field oxide regions 32 to form doped regions (not shown) under field oxide regions 32. The doped regions (not shown) prevent inadvertent turning-on of parasitic transistors formed under field oxide regions 32.

Dielectric layers 34 and 35 are disposed on major surface 23 overlying wells 27 and 28, respectively. By way of example, dielectric layers 34 and 35 are silicon dioxide layers having a thickness between approximately 5 nanometers (nm) and approximately 50 nm. Dielectric layer 34 serves as a gate dielectric layer of FET 11. Dielectric layer 35 serves as a dielectric layer of capacitor 12. In one embodiment, gate dielectric layer 34 and dielectric layer 35 are formed by patterning a single dielectric layer or a single dielectric stack disposed over major surface 23 overlying both wells 27 and 28. In an alternative embodiment, gate dielectric layer 34 and dielectric layer 35 are formed in different dielectric layer growth, deposition, and/or patterning processes. Thus, the thickness of each of gate dielectric layer 34 and dielectric layer 35 can be individually adjusted.

A conductive layer 36 is deposited over substrate 21 and patterned to overlie gate dielectric layer 34 of FET 11 and dielectric layer 35 of capacitor 12, forming floating gate 14 (shown in FIG. 1) of FET 11 and the top conductor of capacitor 12. By way of example, conductive layer 36 is a polycrystalline silicon layer having a thickness that is in a range between approximately 150 nm and approximately 500 nm. Preferably, polycrystalline silicon layer 36 is doped either during the deposition process or in a subsequent doping step. The portions of conductive layer 36 that overlie gate dielectric layer 34 and dielectric layer 35 are connected together. It should be noted that the connections that couple different portions of conductive layer 36 together are not shown in FIG. 2. Gate dielectric layer 34 and the portion of conductive layer 36 thereon form a gate structure of FET 11. Dielectric layer 35, the portion of conductive layer 36 thereon, and well 28 cooperate to form capacitor 12, wherein well 28 serves as the bottom conductor of capacitor 12.

An insulating layer 38 is formed over conductive layer 36, and on the sidewalls of conductive layer 36 and dielectric layers 34 and 35. Insulating layer 38 is preferably patterned to cap the gate structure of FET 11 and capacitor 12. Further, insulating layer 38 preferably caps the connections which electrically couple different portions of conductive layer 36 together. Insulating layer 38 can be an oxide-nitride stack comprised of a silicon nitride layer on top of a silicon dioxide layer, an oxide-nitride-oxide stack comprised of a silicon nitride layer between a top silicon dioxide layer and a bottom silicon dioxide layer, a silicon oxynitride layer, or the like. During the operation of NVM device 20, insulating layer 38 minimizes the charge leakage from floating gate 14 (shown in FIG. 1), thereby improving the data retention rate and the reliability of NVM device 20. Although preferred, it should be understood that insulating layer 38 is an optional feature of NVM device 20.

Ions of N conductivity type, e.g., phosphorus or arsenic ions, are implanted through the openings in a masking layer (not shown) and in field oxide regions 32 into epitaxial layer 22 to form a source region 41 and a drain region 42 of FET 11 in well 27. Source region 41 and drain region 42 define a channel region 51 therebetween and under gate dielectric layer 34. In other words, channel region 51 of FET 11 separates source region 41 from drain region 42. In operation, a channel is formed in channel region 51 when FET 11 is switched on. By way of example, source region 41 and drain region 42 have a dopant concentration between approximately $1 \times 10^{15}$ atoms/cm$^3$ and approximately $5 \times 10^{22}$ atoms/cm$^3$. The ion implantation process also forms N conductivity type doped regions 43 and 44 in epitaxial layer 22 outside wells 27 and 28. Doped regions 43 and 44 serve as contact regions to epitaxial layer 22. The ion implantation process further forms an N conductivity type doped region 46 in well 28.

Ions of P conductivity type, e.g., boron or boron fluoride ions, are implanted into epitaxial layer 22 to form a P conductivity type doped region 47 in well 28 adjacent dielectric layer 35 and N conductivity type doped region 46. The ion implantation process also forms a substrate contact region 49 of FET 11 in well 27. By way of example, P conductivity type doped region 47 and substrate contact region 49 have a dopant concentration between approximately $1 \times 10^{15}$ atoms/cm$^3$ and approximately $5 \times 10^{22}$ atoms/cm$^3$. Doped region 46 of N conductivity type and doped region 47 of P conductivity type form a contact region 48 of capacitor 12.

An insulating layer 53 is disposed over substrate 21 and optionally planarized. By way of example, insulating layer 53 is silicon dioxide and has a thickness ranging from approximately 300 nm to approximately 1500 nm. Insulating layer 53 may be referred to as an interlayer dielectric and provides electrical isolation between NVM device 20 and other devices (not shown) that may be fabricated on substrate 21. A plurality of metallization regions are formed in insulating layer 53 to form the terminals of NVM device 20. A metallization region 54 is connected to contact regions 43 and 44 in epitaxial layer 22 and serves as an epi-bias terminal of NVM device 20. Although contact regions 43 and 44 are shown as being connected by a single metallization region 54, it should be understood that this is not a limitation of the present invention. Each of contact regions 43 and 44 may be contacted by its own metallization region. A metallization region 55 is connected to contact region 48 in well 28 and serves as control terminal 15 of NVM device 20. Metallization region 55 also electrically couples N conductivity type doped region 46 to P conductivity type doped region 47. Although doped regions 46 and 47 are shown as being connected by a single metallization region 55, it should be understood that this is not a limitation of the present invention. In an alternative embodiment, each of doped regions 46 and 47 is contacted by its own metallization region. A metallization region 56 is connected to source region 41 of FET 11 and serves as source terminal 16 of NVM device 20. A metallization region 57 is connected to drain region 42 of FET 11 and serves as drain terminal 17 of NVM device 20. A metallization region 58 is connected to substrate contact region 49 of FET 11 and serves as substrate terminal 18 of NVM device 20.

As described herein with reference to FIG. 2, NVM device 20 includes a single conductive layer 36. Thus, NVM device 20 is also referred to as a single level gate NVM device or a single poly NVM device. It should be understood that the structure and the fabrication process of NVM device 20 are not limited to those described hereinbefore. For example, the portions of conductive layer 36 over gate dielectric layer 34 and dielectric layer 35 can be separated from each other and electrically coupled to each other via metallization regions (not shown) formed in insulating layer 53. Further, NVM device 20 can be formed in a P conductivity type epitaxial layer on an N conductivity type substrate.

Figure 3:
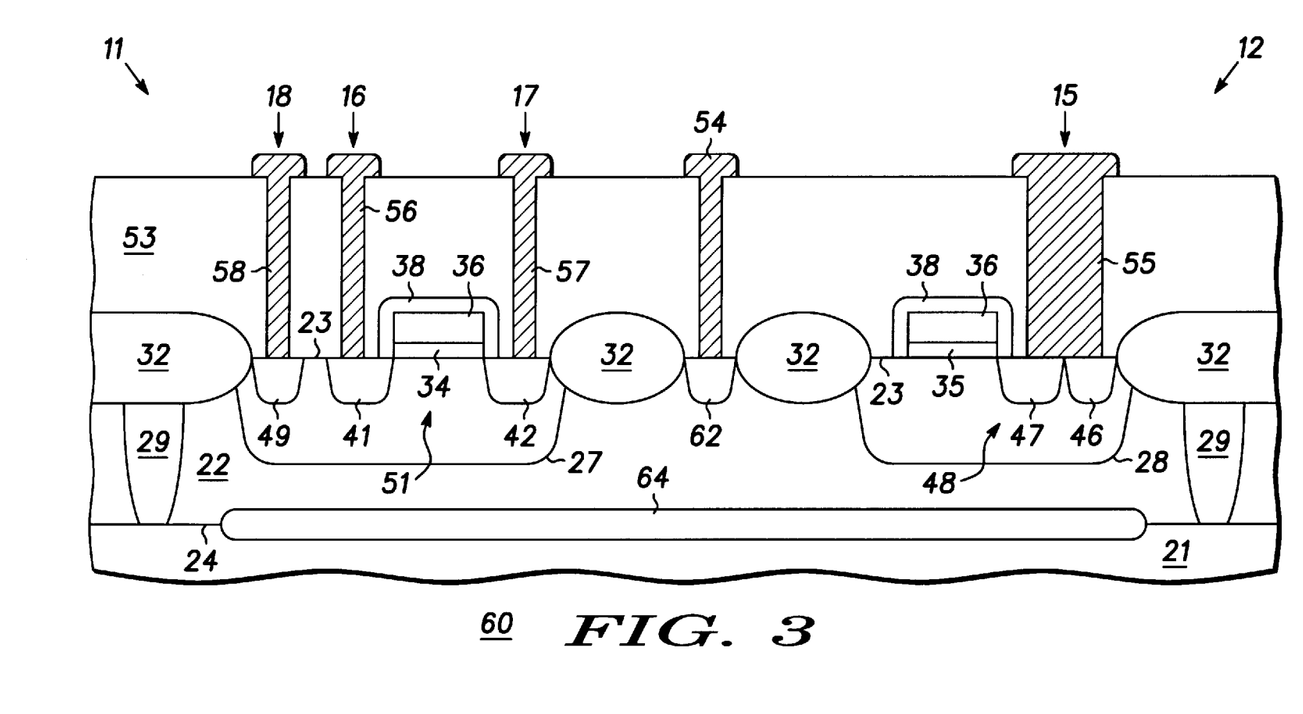

FIG. 3 is a cross-sectional view of an NVM device 60 in accordance with a second embodiment of the present invention. The structure of NVM device 60 is similar to that of NVM device 20 shown in FIG. 2. A difference between the structures of NVM device 60 and NVM device 20 is that P+ sinker 31 (shown in FIG. 2) is absent from NVM device 60. Therefore, NVM device 60 includes one P+ sinker, i.e., sinker 29, which has a ring structure and encloses wells 27 and 28. Other differences include a single contact region 62 contacting epitaxial layer 22 and a single buried layer 64 in NVM device 60. Buried layer 64 is under both wells 27 and 28. By eliminating sinker 31 and forming a single contact region 62 to epitaxial layer 22, the silicon area of NVM device 60 is reduced compared with that of NVM device 20 shown in FIG. 2. On the other hand, better isolation between FET 11 and capacitor 12 is provided by forming sinker 31 between wells 27 and 28. Like NVM device 20 shown in FIG. 2, NVM device 60 includes a single conductive layer 36 and is also referred to as a single level gate NVM device or a single poly NVM device.

The processes of programming and erasing NVM device 10 depend on the gate capacitance of FET 11 and the capacitance of capacitor 12. It should be noted that the structure of NVM device 10 may be that of NVM device 20 shown in FIG. 2, NVM device 60 shown in FIG. 3, or the like. Factors affecting the gate capacitance of FET 11 include the size of FET 11 and the thickness of gate dielectric layer 34. Similarly, factors affecting the capacitance of capacitor 12 include the size of capacitor 12 and the thickness of dielectric layer 35. In one embodiment, NVM device 10 is referred to as a capacitor dominated NVM device because the capacitance of capacitor 12 is larger than the gate capacitance of FET 11. In another embodiment, NVM device 10 is referred to as a FET dominated NVM device because the capacitance of capacitor 12 is smaller than the gate capacitance of FET 11.

To electrically program capacitor dominated NVM device 10, source terminal 16, drain terminal 17, and substrate terminal 18 are coupled to a reference voltage level such as, for example, ground. A programming voltage between, for example, approximately 10 volts (V) and approximately 50 V is applied to control terminal 15. The desired programming voltage depends on the thickness of gate dielectric layer 34. The thicker gate dielectric layer 34 is, the higher a programming voltage is typically needed for the programming process to be efficient. A programming epitaxial voltage is applied to epi-bias terminal 54. Preferably, the programming epitaxial voltage at epi-bias terminal 54 is slightly higher than the programming voltage at control terminal 15. Therefore, the P-N junction between well 28 and epitaxial layer 22 is weakly reverse biased. The undepleted region in epitaxial layer 22 between wells 27 and 28 provides isolation between wells 27 and 28. P+ sinker 31 shown in FIG. 2 provides additional isolation between wells 27 and 28. The buried layers under wells 27 and 28, e.g., buried layers 25 and 26 in FIG. 2 or buried layer 64 in FIG. 3, isolate wells 27 and 28 from substrate 21. It should be noted that in the embodiment shown in FIG. 2, if contact regions 43 and 44 had their own metallization regions, only the metallization region contacting the capacitor epitaxial material would be biased high.

The programming voltage is capacitively divided between capacitor 12 and the gate capacitor of FET 11. Because of their respective capacitance values, a larger portion of the programming voltage is across gate dielectric layer 34 of FET 11 than is across dielectric layer 35 of capacitor 12. Charge carriers, e.g., electrons, under gate dielectric layer 34 are attracted by the high voltage at floating gate 14. In a Fowler-Nordheim tunneling process, the charge carriers are injected across gate dielectric layer 34 into conductive layer 36. Floating gate 14 becomes negatively charged. After the programming voltages are removed from NVM device 10, the injected carriers remain in conductive layer 36 and floating gate 14 remains negatively charged. Therefore, a first logic value, e.g., a logic one, is stored in NVM device 10, i.e., NVM device 10 is programmed.

To electrically program FET dominated NVM device 10, control terminal 15 is connected to a reference voltage level such as, for example, ground. A programming voltage between, for example, approximately 10 V and approximately 50 V is applied to source terminal 16, drain terminal 17, and substrate terminal 18. The desired programming voltage depends on the thickness of dielectric layer 35. The thicker dielectric layer 35 is, the higher a programming voltage is typically needed for the programming process to be efficient. A programming epitaxial voltage is applied to epi-bias terminal 54. Preferably, the programming epitaxial voltage at epi-bias terminal 54 is slightly higher than the programming voltage at source terminal 16, drain terminal 17, and substrate terminal 18. Therefore, the P-N junction between well 27 and epitaxial layer 22 is weakly reverse biased. The undepleted region in epitaxial layer 22 between wells 27 and 28 provides isolation between wells 27 and 28. P+ sinker 31 shown in FIG. 2 provides additional isolation between wells 27 and 28. The buried layers under wells 27 and 28, e.g., buried layers 25 and 26 in FIG. 2 or buried layer 64 in FIG. 3, provide isolation between wells 27 and 28 and substrate 21. It should be noted that in the embodiment shown in FIG. 2, if contact regions 43 and 44 had their own metallization regions, only the metallization region contacting the FET epitaxial material would be biased high.

The programming voltage is capacitively divided between the gate capacitor of FET 11 and capacitor 12. Because of their respective capacitance values, a larger portion of the programming voltage is across dielectric layer 35 of capacitor 12 than is across gate dielectric layer 34 of FET 11. Charge carriers, e.g., electrons, under dielectric layer 35 are attracted by the high voltage at conductive layer 36. In a Fowler-Nordheim tunneling process, the charge carriers are injected across dielectric layer 35 into conductive layer 36. Floating gate 14 becomes negatively charged. After the programming voltages are removed from NVM device 10, the injected carriers remain in conductive layer 36 and floating gate 14 remains negatively charged. Therefore, the first logic value, e.g., logic one, is stored in NVM device 10, i.e., NVM device 10 is programmed.

It should be understood that NVM device 10 is not limited to being programmed via a tunneling process. For example, NVM device 10 can also be programmed via a hot carrier injection process. In an embodiment for programming NVM device 10 via the hot carrier injection process, source terminal 16 and substrate terminal 18 are connected to a reference voltage such as, for example, ground, the programming voltage is applied to control terminal 15, and the programming epitaxial voltage is applied to epi-bias terminal 54. A drain voltage between, for example, approximately 1 V and approximately 20 V is applied to drain terminal 17. Preferably, the drain voltage is higher than the reference voltage applied to source terminal 16. Charge carriers, e.g., electrons, originating from source region 41 are accelerated in channel region 51 under floating gate 14 and injected into floating gate 14 adjacent drain region 42 in a hot carrier injection process.

To electrically erase capacitor dominated NVM device 10, control terminal 15 is connected to a reference voltage level such as, for example, ground. An erasing voltage between, for example, approximately 10 V and approximately 50 V is applied to source terminal 16, drain terminal 17, and substrate terminal 18. The desired erasing voltage depends on the thickness of gate dielectric layer 34. The thicker gate dielectric layer 34 is, the higher an erasing voltage is typically needed for the erasing process to be efficient. An erasing epitaxial voltage is applied to epi-bias terminal 54. Preferably, the erasing epitaxial voltage at epi-bias terminal 54 is slightly higher than the erasing voltage at source terminal 16, drain terminal 17, and substrate terminal 18. Therefore, the P-N junction between well 27 and epitaxial layer 22 is weakly reverse biased. The undepleted region in epitaxial layer 22 between wells 27 and 28 provides isolation between wells 27 and 28. P+ sinker 31 shown in FIG. 2 provides additional isolation between wells 27 and 28. The buried layers under wells 27 and 28, e.g., buried layers 25 and 26 in FIG. 2 or buried layer 64 in FIG. 3, isolate wells 27 and 28 from substrate 21.

The erasing voltage is capacitively divided between the gate capacitor of FET 11 and capacitor 12. Because of their respective capacitance values, a larger portion of the erasing voltage is across gate dielectric layer 34 of FET 11 than is across dielectric layer 35 of capacitor 12. Charge carriers, e.g., electrons, on floating gate 14 are attracted by the high voltage at well 27. In a Fowler-Nordheim tunneling process, the charge carriers are injected across gate dielectric layer 34 into well 27. Preferably, the erasing process continues until floating gate 14 becomes substantially neutral or positively charged. After the erasing voltages are removed from NVM device 10, floating gate 14 remains substantially neutral or positively charged. Therefore, a second logic value, e.g., a logic zero, is stored in NVM device 10, i.e., NVM device 10 is erased.

To electrically erase FET dominated NVM device 10, source terminal 16, drain terminal 17, and substrate terminal 18 are coupled to a reference voltage level such as, for example, ground. An erasing voltage between, for example, approximately 10 V and approximately 50 V is applied to control terminal 15. The desired erasing voltage depends on the thickness of dielectric layer 35. The thicker dielectric layer 35 is, the higher an erasing voltage is typically needed for the erasing process to be efficient. An erasing epitaxial voltage is applied to epi-bias terminal 54. Preferably, the erasing epitaxial voltage at epi-bias terminal 54 is slightly higher than the erasing voltage at control terminal 15. Therefore, the P-N junction between well 28 and epitaxial layer 22 is weakly reverse biased. The undepleted region in epitaxial layer 22 between wells 27 and 28 provides isolation between wells 27 and 28. P+ sinker 31 shown in FIG. 2 provides additional isolation between wells 27 and 28. The buried layers under wells 27 and 28, e.g., buried layers 25 and 26 in FIG. 2 or buried layer 64 in FIG. 3, isolate wells 27 and 28 from substrate 21.

The erasing voltage is capacitively divided between capacitor 12 and the gate capacitor of FET 11. Because of their respective capacitance values, a larger portion of the erasing voltage is across dielectric layer 35 of capacitor 12 than is across gate dielectric layer 34 of FET 11. Charge carriers, e.g., electrons, on floating gate 14 are attracted by the high voltage at well 28. In a Fowler-Nordheim tunneling process, the charge carriers are injected across dielectric layer 35 into well 28. Preferably, the erasing process continues until floating gate 14 becomes substantially neutral or positively charged. After the erasing voltages are removed from NVM device 10, floating gate 14 remains substantially neutral or positively charged. Therefore, the second logic value, e.g., logic zero, is stored in NVM device 10, i.e., NVM device 10 is erased.

The process of reading data from NVM device 10 is independent of whether NVM device 10 is capacitor dominated or FET dominated. To read data from NVM device 10, source terminal 16 and substrate terminal 18 are connected to a reference voltage such as, for example, ground. Drain terminal 17 is coupled to another reference voltage such as, for example, a supply voltage $V_{DD}$. By way of example, the supply voltage $V_{DD}$ ranges from approximately 0.9 V to approximately 10 V. A reading voltage between, for example, approximately 0.5 V and 12 V is applied to control terminal 15. A reading epitaxial voltage between, for example, approximately 0 V and approximately 25 V is applied to epi-bias terminal 54 to reverse bias the P-N junctions between well 27 and epitaxial layer 22 and between well 28 and epitaxial layer 22. The undepleted region in epitaxial layer 22 between wells 27 and 28 provides isolation between wells 27 and 28. P+ sinker 31 shown in FIG. 2 provides additional isolation between wells 27 and 28. The buried layers under wells 27 and 28, e.g., buried layers 25 and 26 in FIG. 2 or buried layer 64 in FIG. 3, isolate wells 27 and 28 from substrate 21. In order to avoid hot carrier injection during the reading process, the voltages applied to control terminal 15 and drain terminal 17 are preferably lower than the voltage levels required to cause significant hot carrier injection.

Because floating gate 14 is capacitively coupled to control terminal 15, source terminal 16, drain terminal 17, and substrate terminal 18, the voltages applied to these terminals and the electric charge stored in floating gate 14 determine the voltage level of floating gate 14. If NVM device 10 has been programmed, floating gate 14 is negatively charged, and the effective threshold voltage of FET 11 is higher than its intrinsic threshold voltage when floating gate 14 is substantially neutral. If NVM device 10 has been erased, floating gate 14 is substantially neutral or positively charged, and the effective threshold voltage of FET 11 is substantially equal to or lower than its intrinsic threshold voltage. During the reading process, NVM device 10 is preferably biased so that the voltage level of floating gate 14 is lower than the effective threshold voltage of FET 11 if NVM device 10 is programmed and higher than the effective threshold voltage of FET 11 if NVM device 10 is erased. Therefore, when reading data from a programmed NVM device 10, FET 11 is nonconductive and the current flowing through channel region 51 is small, e.g., less than approximately 2 microamperes ($\mu A$). A sense amplifier (not shown) coupled to drain terminal 17 senses the small current and reads a logic one from NVM device 10. On the other hand, when reading data from an erased NVM device 10, FET 11 is conductive. The current flowing through channel region 51 is large, e.g., greater than approximately 5 $\mu A$. The sense amplifier (not shown) coupled to drain terminal 17 senses the large current and reads a logic zero from NVM device 10.

It should be noted that the reading process is not limited to that described hereinbefore. In an alternative embodiment, the reading process is performed by applying the supply voltage to source terminal 16 while grounding drain terminal 17 and substrate terminal 18. Thus, source region 41 functions as a drain of FET 11 and drain region 42 functions as a source of FET 11 during the reading process. A sense amplifier (not shown) coupled to source terminal 16 senses the current flowing through FET 11 and reads out data stored in NVM device 10.

Figure 4:
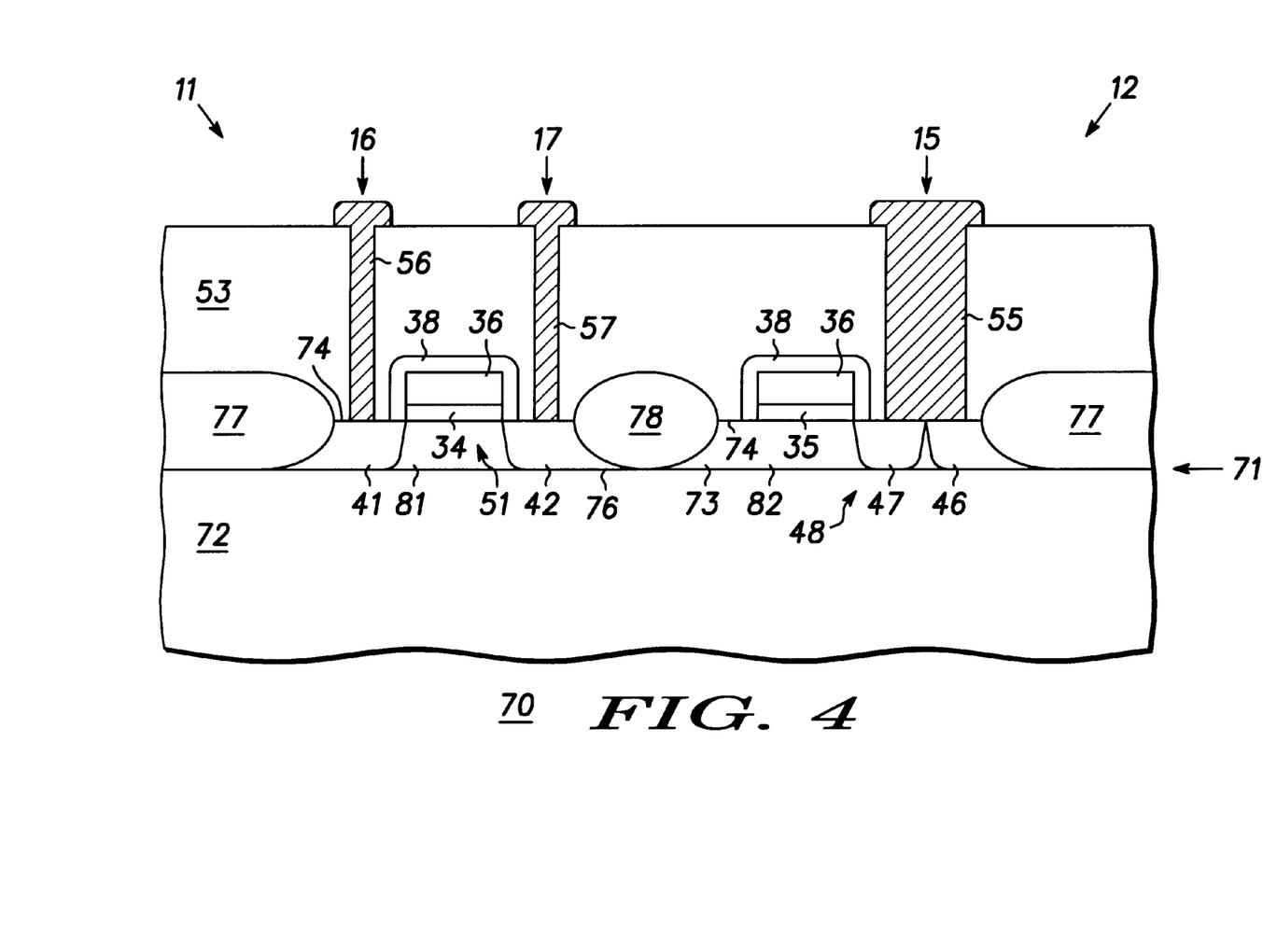

FIG. 4 is a cross-sectional view of an NVM device 70 in accordance with a third embodiment of the present invention. Schematically, NVM device 70 is represented by NVM device 10 shown in FIG. 1. NVM device 70 is fabricated on a semiconductor on insulator substrate 71. By way of example, semiconductor on insulator substrate 71 is a thin film silicon on insulator (SOI) substrate comprised of an insulator substrate 72 and a P conductivity type silicon layer 73 disposed thereon. Silicon layer 73 has a thickness between, for example, approximately 50 nm and approximately 200 nm and a dopant concentration between, for example, approximately $1 \times 10^{12}$ atoms/cm$^3$ and approximately $5 \times 10_{16}$ atoms/cm$^3$. Silicon layer 73 has a major surface 74 facing away from an interface 76 between silicon layer 73 and insulator substrate 72.

Isolation structures such as, for example, field oxide regions 77 and 78 are formed in silicon layer 73 using techniques well known to those skilled in the art. Field oxide regions 77 and 78 extend from major surface 74 to interface 76. Preferably, field oxide region 77 is configured as a ring structure surrounding portions of silicon layer 73, e.g., active regions 81 and 82 in silicon layer 73. FIG. 4 shows a cross section of the ring structure. In subsequent process steps, FET 11 and capacitor 12 are formed in active regions 81 and 82, respectively. Further, field oxide region 78 is preferably configured to separate active region 81 from active region 82.

The structures of dielectric layers 34 and 35, conductive layer 36, insulating layer 38, source region 41, drain region 42, channel region 51, and N conductivity type doped region 46 and P conductivity type region 47 that form contact region 48 in NVM device 70 are similar to corresponding layers and regions in NVM devices 20 and 60 shown in FIGS. 2 and 3, respectively. The structures of interlayer dielectric 53 and metallization regions 55, 56, and 57 in NVM device 70 are also similar to those of NVM devices 20 and 60 shown in FIGS. 2 and 3, respectively. Metallization regions 55, 56, and 57 serve as control terminal 15, source terminal 16, and drain terminal 17, respectively, of NVM device 70. Although doped regions 46 and 47 are shown as being connected by a single metallization region 55, it should be understood that this is not a limitation of the present invention. In an alternative embodiment, each of doped regions 46 and 47 is contacted by its own metallization region. Like NVM devices 20 and 60 shown in FIGS. 2 and 3, respectively, NVM device 70 includes a single conductive layer 36 and is also referred to as a single level gate NVM device or a single poly NVM device.

It should be noted that contact regions 43 and 44, contact region 62, and metallization region 54 in NVM device 20 or 60 shown in FIG. 2 or 3 are absent from NVM device 70. It should also be noted that substrate terminal 18 (shown in FIG. 1) is an optional feature of NVM device 70. To form substrate terminal 18 (shown in FIG. 1), a metallization region is formed in interlayer dielectric 53 and electrically coupled to channel region 51 via a substrate contact region outside the cross-section shown in FIG. 4. Therefore, the substrate contact region and the metallization region that form substrate terminal 18 are not shown in FIG. 4.

Figure 5:
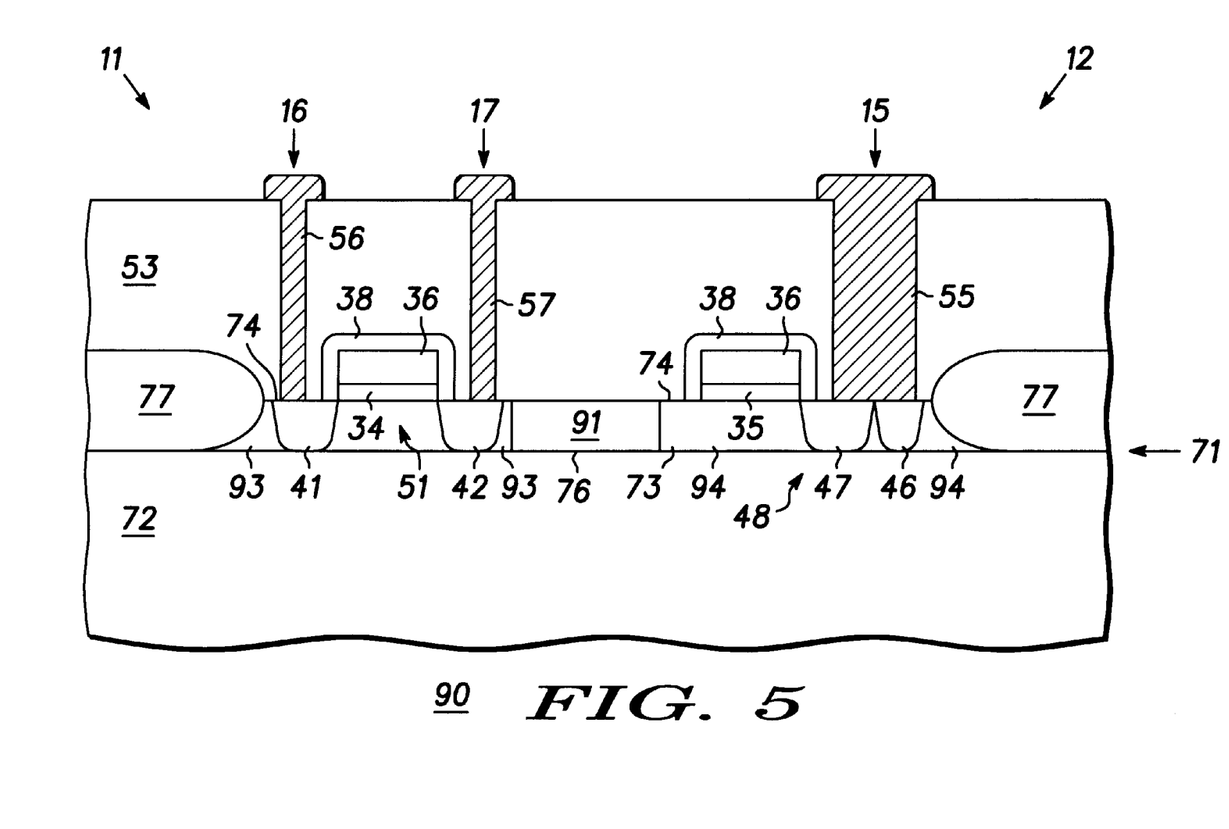

FIG. 5 is a cross-sectional view of an NVM device 90 in accordance with a fourth embodiment of the present invention. Schematically, NVM device 90 is represented by NVM device 10 shown in FIG. 1. Like NVM device 70 shown in FIG. 4, NVM device 90 is fabricated on an SOI substrate 71 comprised of an insulator substrate 72 and a P conductivity type silicon layer 73 disposed thereon. Silicon layer 73 has a major surface 74 facing away from an interface 76 between silicon layer 73 and insulator substrate 72.

An isolation structures such as, for example, a field oxide regions 77 is formed in silicon layer 73 extend from major surface 74 to interface 76. Preferably, field oxide region 77 is configured as a ring structure surrounding a portion of silicon layer 73 in which NVM device 90 is formed. FIG. 5 shows a cross section of the ring structure.

Ions of N conductivity type, e.g., phosphorus ions or arsenic ions, are implanted into silicon layer 73 to form a N conductivity type doped region 91 that extends from major surface 74 to interface 76. N conductivity doped region 91 separates P conductivity type regions 93 and 94 from each other. In subsequent process steps, FET 11 and capacitor 12 are formed in P conductivity type regions 93 and 94, respectively. In an alternative embodiment, doped region 91 is formed in the same steps as source region 41 and drain region 42 in FET 11.

The structures of dielectric layers 34 and 35, conductive layer 36, insulating layer 38, source region 41, drain region 42, channel region 51, and N conductivity type doped region 46 and P conductivity type region 47 that form contact region 48 in NVM device 90 are similar to corresponding layers and regions in NVM device 70 shown in FIG. 4. The structures of interlayer dielectric 53 and metallization regions 55, 56, and 57 in NVM device 90 are also similar to those of NVM device 70 shown in FIG. 4. Metallization regions 55, 56, and 57 serve as control terminal 15, source terminal 16, and drain terminal 17, respectively, of NVM device 90. Although doped regions 46 and 47 are shown as being connected by a single metallization region 55, it should be understood that this is not a limitation of the present invention. In an alternative embodiment, each of doped regions 46 and 47 is contacted by its own metallization region. Like NVM device 70 shown in FIG. 4, NVM device 90 includes a single conductive layer 36 and is also referred to as a single level gate NVM device or a single poly NVM device.

The process of accessing NVM devices 70 and 90 is similar to the process of accessing NVM device 10 represented either by NVM device 20 shown in FIG. 2 or NVM device 60 shown in FIG. 3. The processes of programming and erasing NVM devices 70 and 90 also depend on whether NVM devices 70 and 90 are capacitor dominated, i.e., the capacitance of capacitor 12 is larger than the gate capacitance of FET 11, or FET dominated, i.e., the capacitance of capacitor 12 is smaller than the gate capacitance of FET 11. A difference between accessing NVM devices 70 and 90 and accessing NVM devices 20 and 60 shown in FIGS. 2 and 3, respectively, is that no epi-bias voltage is applied to NVM devices 70 and 90. During the processes of programming, erasing, and reading NVM devices 70 and 90, field oxide region 77 and insulator substrate 72 isolate NVM devices 70 and 90 from other devices that may be formed on SOI substrate 71. In NVM device 70, field oxide region 78 and insulator substrate 72 isolate FET 11 and capacitor 12 from each other. In NVM device 90, N conductivity type doped region 91 and insulator substrate 72 isolate FET 11 and capacitor 12 from each other. In one embodiment, region 91 is floating when accessing NVM device 90. In an alternative embodiment, region 91 is biased at a voltage level higher than the voltages applied to P conductivity type regions 93 and 94 during the process of accessing NVM device 90.

By now it should be appreciated that an NVM device and a method for accessing the NVM device have been provided. The NVM device includes a floating gate FET and a capacitor formed in different portions of a substrate and isolated from each other. The NVM device of the present invention is both electrically erasable and electrically programmable. Compared with single-poly EEPROM devices in the prior art, the NVM device is simple, cost efficient to fabricate, silicon area efficient, and suitable for use in high density integrated circuits.

We claim:

1. A single level gate nonvolatile memory device, comprising:
   a semiconductor substrate of a first conductivity type;
   a semiconductor layer of a second conductivity type and a first dopant concentration on the semiconductor substrate, the semiconductor layer having a major surface facing away from an interface between the semiconductor layer and the semiconductor substrate;
   a first well of the first conductivity type extending from the major surface into the semiconductor layer;
   a source region and a drain region of the second conductivity type in the first well and defining a channel region therebetween;
   a first dielectric layer over the major surface overlying the channel region;
   a second well of the first conductivity type extending from the major surface into the semiconductor layer;
   a second dielectric layer over the major surface overlying a portion of the second well;
   a first contact region in the second well adjacent the second dielectric layer;
   a single floating conductive layer over the major surface and overlying the first dielectric layer and the second dielectric layer; and
   a first sinker of the first conductivity type extending from the major surface to the interface and enclosing the first well and the second well.

2. The single level gate nonvolatile memory device of claim 1, wherein the first contact region includes:
   a first doped region of the first conductivity type adjacent the second dielectric layer; and
   a second doped region of the second conductivity type adjacent and electrically coupled to the first doped region.

3. The single level gate nonvolatile memory device of claim 1, further comprising a substrate contact region of the first conductivity type in the first well.

4. The single level gate nonvolatile memory device of claim 1, further comprising a second contact region of the second conductivity type in the semiconductor layer and outside the first well and the second well.

5. The single level gate nonvolatile memory device of claim 1, further comprising a buried layer of the second conductivity type and a second dopant concentration under the first well and the second well, the second dopant concentration being higher than the first dopant concentration.

6. The single level gate nonvolatile memory device of claim 1, further comprising a second sinker of the first conductivity type in the semiconductor layer and separating the first well from the second well, the second sinker extending from the major surface to the interface.

7. The single level gate nonvolatile memory device of claim 6, further comprising:
   a first buried layer of the second conductivity type and a second dopant concentration under the first well, the second dopant concentration being higher than the first dopant concentration; and
   a second buried layer of the second conductivity type and a third dopant concentration under the second well, the third dopant concentration being higher than the first dopant concentration.

8. The single level gate nonvolatile memory device of claim 1, further comprising an insulating layer capping the single floating conductive layer, the first dielectric layer, and the second dielectric layer.

9. The single level gate nonvolatile memory device of claim 1, wherein the first dielectric layer and the second dielectric layer are patterned from a single dielectric layer stack disposed over the major surface of the semiconductor layer.

* * * * *